(12) United States Patent
Nagano et al.

(10) Patent No.: US 8,248,564 B2
(45) Date of Patent: Aug. 21, 2012

(54) LIQUID CRYSTAL DISPLAY DEVICE AND METHOD OF MANUFACTURING THE SAME

(75) Inventors: Shingo Nagano, Tokyo (JP); Osamu Miyakawa, Kumamoto (JP); Nobuaki Ishiga, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 528 days.

(21) Appl. No.: 12/401,226

(22) Filed: Mar. 10, 2009

(65) Prior Publication Data
US 2009/0230401 A1 Sep. 17, 2009

(30) Foreign Application Priority Data

Mar. 13, 2008 (JP) ................................. 2008-064600

(51) Int. Cl.
*G02F 1/1343* (2006.01)
(52) U.S. Cl. ........................................................ 349/141
(58) Field of Classification Search .................. 349/139, 349/141
See application file for complete search history.

(56) References Cited

U.S. PATENT DOCUMENTS

| | | | | |
|---|---|---|---|---|
| 5,886,762 A * | 3/1999 | Lee et al. | ....................... | 349/141 |
| 2001/0007779 A1 | 7/2001 | Lee et al. | | |
| 2001/0046027 A1 | 11/2001 | Tai et al. | | |
| 2002/0041354 A1 | 4/2002 | Noh et al. | | |
| 2005/0078262 A1 | 4/2005 | Ono et al. | | |

FOREIGN PATENT DOCUMENTS

| | | |
|---|---|---|
| JP | H11-002836 A | 1/1999 |
| JP | 2001-83540 | 3/2001 |
| JP | 2001-235763 | 8/2001 |
| JP | 2002-182230 | 6/2002 |
| JP | 2007-011091 A | 1/2007 |
| JP | 2007-086205 A | 4/2007 |
| WO | WO 01/18597 A1 | 3/2001 |

OTHER PUBLICATIONS

U.S. Appl. No. 12/369,332, filed Feb. 11, 2009, Nagano, et al.
Office Action issued May 15, 2012 in Japanese Patent Application No. 2008-064600 filed Mar. 13, 2008 (with English Translation).

* cited by examiner

*Primary Examiner* — Sarah Hahm
(74) *Attorney, Agent, or Firm* — Oblon, Spivak, McClelland, Maier & Neustadt, L.L.P.

(57) ABSTRACT

A liquid crystal display device includes a gate line placed above a substrate, a gate insulating layer to cover the gate line, a source line placed above the gate insulating layer, an interlayer insulating layer to cover the source line, a comb-shaped or slit-shaped pixel electrode electrically connected a drain electrode of a TFT through a contact hole penetrating the interlayer insulating layer, a first counter electrode placed below and opposite to the pixel electrode with an insulating layer interposed therebetween to generate an oblique electric field with the pixel electrode, and a second counter electrode formed in the same layer as the pixel electrode and placed overlapping the source line in a given area to generate an in-plane electric field with the pixel electrode.

9 Claims, 6 Drawing Sheets

LIQUID CRYSTAL DISPLAY DEVICE AND METHOD OF MANUFACTURING THE SAME

BACKGROUND OF THE INVENTION

1. Field of the Invention

The present invention relates to a liquid crystal display device and a method of manufacturing the same and, particularly, to a wide viewing angle liquid crystal display device and a method of manufacturing the same.

2. Description of Related Art

An in-plane switching (IPS) mode of a liquid crystal display device is a display technique that displays an image by applying an in-plane electric field to liquid crystal placed between substrates. The IPS mode provides better viewing angle characteristics than a twisted nematic (TN) mode, and it is expected to meet the demand for high quality pictures.

An IPS mode liquid crystal display device generally has a structure in which a pixel electrode and a counter electrode are made of metal films and arranged opposite to each other on the same substrate. In the liquid crystal display device having such a structure, it is difficult to increase a pixel aperture ratio compared with the TN mode, thus having low light use efficiency.

In order to improve the aperture ratio and the transmittance in the IPS mode liquid crystal display device, a fringe-field switching (FFS) mode has been proposed (e.g. Japanese Unexamined Patent Application Publications Nos. 2001-235763 and 2002-182230). The FFS mode of a liquid crystal display device is a display technique that displays an image by applying an oblique electric field (fringe electric field) to liquid crystal placed between substrates. Because a pixel electrode and a counter electrode are made of transparent conductive layers in the FFS mode liquid crystal display device, the aperture ratio and the transmittance are higher than those of the IPS mode. Further, because capacitance is formed between the transparent conductive layers in the FFS mode liquid crystal display device, there is no loss of transmittance due to a capacitance forming portion.

In the FFS mode liquid crystal display device according to related art, liquid crystal is driven by a fringe electric field that is generated between the pixel electrode having a slit placed in an upper layer and the counter electrode placed in a lower layer with an insulating layer interposed therebetween. The pixel electrode is placed away from the source line in each pixel so as not to overlap the source line in order to reduce the capacitance between the source line and the pixel electrode. Specifically, the pixel electrode is placed at a certain distance from the source line. By reducing the capacitance between the source line and the pixel electrode, it is possible to prevent deterioration of display quality.

In this structure, however, when a voltage is applied to the source line, an electric field is generated by the voltage, causing a change in the orientation of liquid crystal over a relatively wide range in the vicinity of the source line. Because the counter electrode is placed in a layer that is lower than the source line in the FFS mode liquid crystal display device according to related art, the electric field from the source line cannot be shielded. As a result, light leakage occurs in the vicinity of the source line. In order to block the leakage light in the vicinity of the source line, a black matrix to cover the source line and the vicinity of the source line is placed on the counter substrate side in the FFS mode liquid crystal display device according to related art. The black matrix is placed to overlap the source line and the relatively wide range in the vicinity of the source line. Thus, an invalid region (non-transmitting region) that does not contribute to display increases in the vicinity of the source line, causing a decrease in aperture ratio.

In light of the foregoing, it is desirable to provide a wide viewing angle liquid crystal display device capable of improving an aperture ratio and a method of manufacturing the same.

SUMMARY OF THE INVENTION

According to an aspect of an embodiment of the present invention, there is provided a liquid crystal display device including a thin film transistor placed above a substrate, which includes a gate line electrically connected to a gate electrode of the thin film transistor, a gate insulating layer to cover the gate line, a source line placed above the gate insulating layer and electrically connected to a source electrode of the thin film transistor, an interlayer insulating layer to cover the source line, a pixel electrode having a comb shape or a slit shape and electrically connected a drain electrode of the thin film transistor through a contact hole penetrating the interlayer insulating layer, a first counter electrode placed below and opposite to the pixel electrode with an insulating layer interposed therebetween to generate an oblique electric field with the pixel electrode, and a second counter electrode formed in the same layer as the pixel electrode and placed overlapping the source line in a given area to generate an in-plane electric field with the pixel electrode.

According to another aspect of an embodiment of the present invention, there is provided a method of manufacturing a liquid crystal display device including a thin film transistor placed above a substrate, which includes steps of forming a gate line to be electrically connected to a gate electrode of the thin film transistor above or below a first counter electrode provided with a common voltage and covering the gate line and the first counter electrode with a gate insulating layer, forming a source line to be electrically connected to a source electrode of the thin film transistor above the gate insulating layer, forming an interlayer insulating layer to cover the source line, and forming a pixel electrode having a comb shape or a slit shape to be electrically connected a drain electrode of the thin film transistor through a contact hole penetrating the interlayer insulating layer and generate an oblique electric field with the first counter electrode, and a second counter electrode to overlap the source line in a given area and generate an in-plane electric field with the pixel electrode.

According to the embodiments of the present invention described above, it is possible to provide a wide viewing angle liquid crystal display device capable of improving an aperture ratio and a method of manufacturing the same.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

First Embodiment

Figure 1:
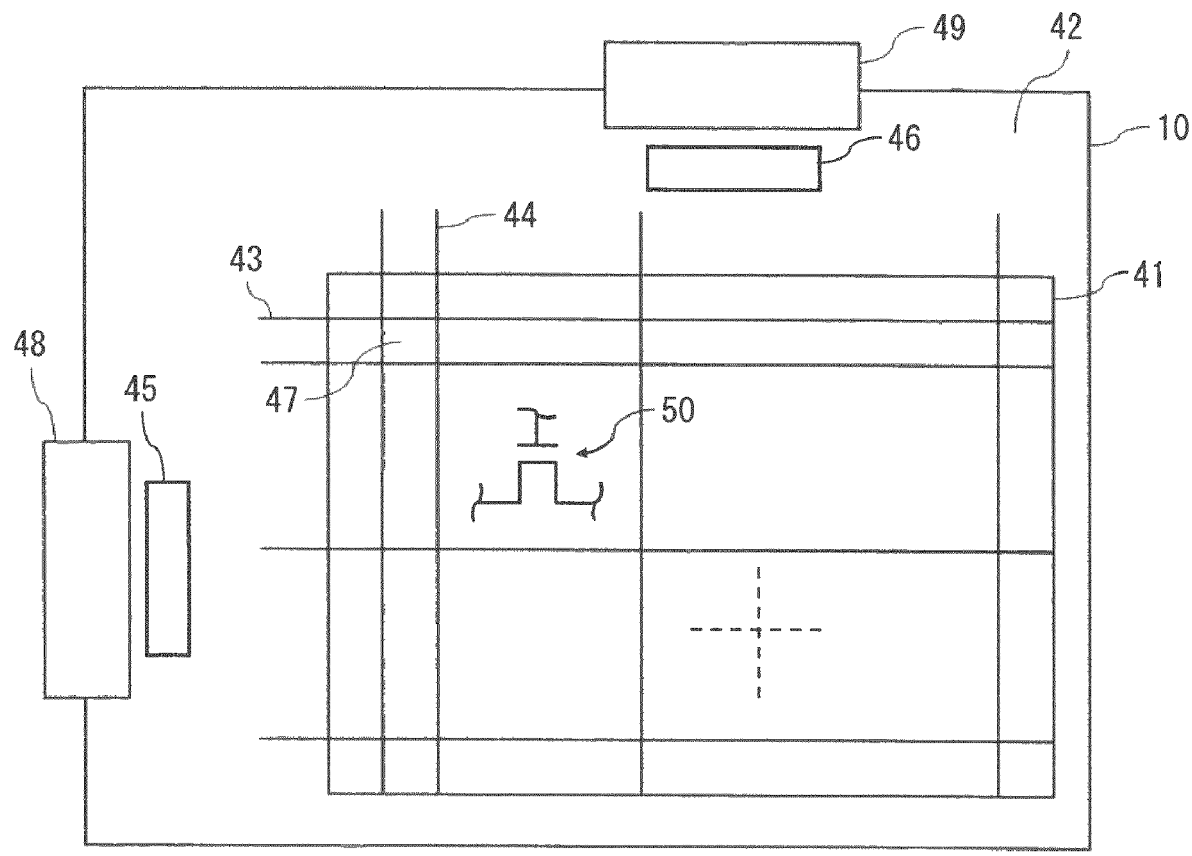
FIG. 1 is a front view showing the structure of a TFT array substrate to be used in a liquid crystal display device.

A liquid crystal display device according to an embodiment of the present invention is described hereinafter with reference to FIG. 1. FIG. 1 is a front view showing the structure of a thin film transistor (TFT) array substrate to be used in a liquid crystal display device. The liquid crystal display device according to the embodiment is a liquid crystal display device in which a pixel electrode and a counter electrode are placed in the TFT array substrate. The overall structure of the liquid crystal display device is the same between the first and second embodiments described below.

The liquid crystal display device according to the embodiment includes a substrate 10. The substrate 10 is an array substrate such as a TFT array substrate. The substrate 10 includes a display area 41 and a frame area 42 surrounding the display area 41. The display area 41 includes a plurality of gate lines (scanning signal lines) 43 and a plurality of source lines (display signal lines) 44. The plurality of gate lines 43 are arranged in parallel with each other. Likewise, the plurality of source lines 44 are arranged in parallel with each other. The gate lines 43 and the source lines 44 intersect with each other. Each area surrounded by the adjacent gate lines 43 and source lines 44 is a pixel 47. Thus, a plurality of pixels 47 are arranged in matrix in the substrate 10.

The frame area 42 of the substrate 10 includes a scanning signal driving circuit 45 and a display signal driving circuit 46. The gate lines 43 extend from the display area 41 to the frame area 42 and are connected to the scanning signal driving circuit 45 at the end of the substrate 10. Likewise, the source lines 44 extend from the display area 41 to the frame area 42 and are connected to the display signal driving circuit 46 at the end of the substrate 10. An external line 48 is connected in the vicinity of the scanning signal driving circuit 45. Further, an external line 49 is connected in the vicinity of the display signal driving circuit 46. The external lines 48 and 49 are wiring boards such as a flexible printed circuit (FPS), for example.

External signals are supplied to the scanning signal driving circuit 45 and the display signal driving circuit 46 through the external lines 48 and 49. The scanning signal driving circuit 45 supplies a gate signal (scanning signal) to the gate lines 43 based on an external control signal. The gate lines 43 are sequentially selected by the gate signal. On the other hand, the display signal driving circuit 46 supplies a display signal to the source lines 44 based on an external control signal and display data. A display voltage according to display data is thereby supplied to each pixel 47.

Each pixel includes at least one TFT 50. The TFT 50 is placed in the vicinity of the intersection of the source line 44 and the gate line 43. For example, the TFT 50 supplies a display voltage to a pixel electrode. Specifically, the TFT 50, which is a switching element, is turned on by the gate signal from the gate line 43. A display voltage is thereby applied from the source line 44 to the pixel electrode that is connected to a drain electrode of the TFT 50. A fringe electric field and an in-plane (horizontal) electric field corresponding to the display voltage are generated between the pixel electrode and the counter electrode. Further, an alignment layer (not shown) is placed on the surface of the substrate 10. The detailed structure of the pixel 47 is described later.

Further, a counter substrate is placed opposite to the substrate 10. The counter substrate is a color filter substrate, for example, and placed on the viewing side. The counter substrate includes a color filter, a black matrix (BM), an alignment layer and so on. A liquid crystal layer is placed between the substrate 10 and the counter substrate. In other words, liquid crystal is filled between the substrate 10 and the counter substrate. Further, a polarization plate, a retardation film and so on are placed on the outer sides of the substrate 10 and the counter substrate. Furthermore, a backlight unit or the like is placed on the non-viewing side of the liquid crystal display panel.

The liquid crystal is driven by the fringe electric field and the in-plane (horizontal) electric field between the pixel electrode and the counter electrode. Thus, the orientation of the liquid crystal between the substrates varies. The polarization state of light passing through the liquid crystal layer thereby changes. In other words, the polarization state of linearly polarized light having passed through the polarization plate changes by the liquid crystal layer. Specifically, light from the backlight unit becomes linearly polarized light by the polarization plate on the array substrate side. Then, the linearly polarized light passes through the liquid crystal layer, so that its polarization state changes.

The amount of light passing through the polarization plate on the counter substrate side varies depending on the polarization state. Specifically, among the transmitted light that transmits through the liquid crystal display panel from the backlight unit, the amount of light passing through the polarization plate on the viewing side varies. The orientation of liquid crystal varies depending on a display voltage to be applied. Therefore, it is possible to change the amount of light passing through the polarization plate on the viewing side by controlling the display voltage. Thus, by varying the display voltage for each pixel, it is possible to display a desired image.

Figure 2:
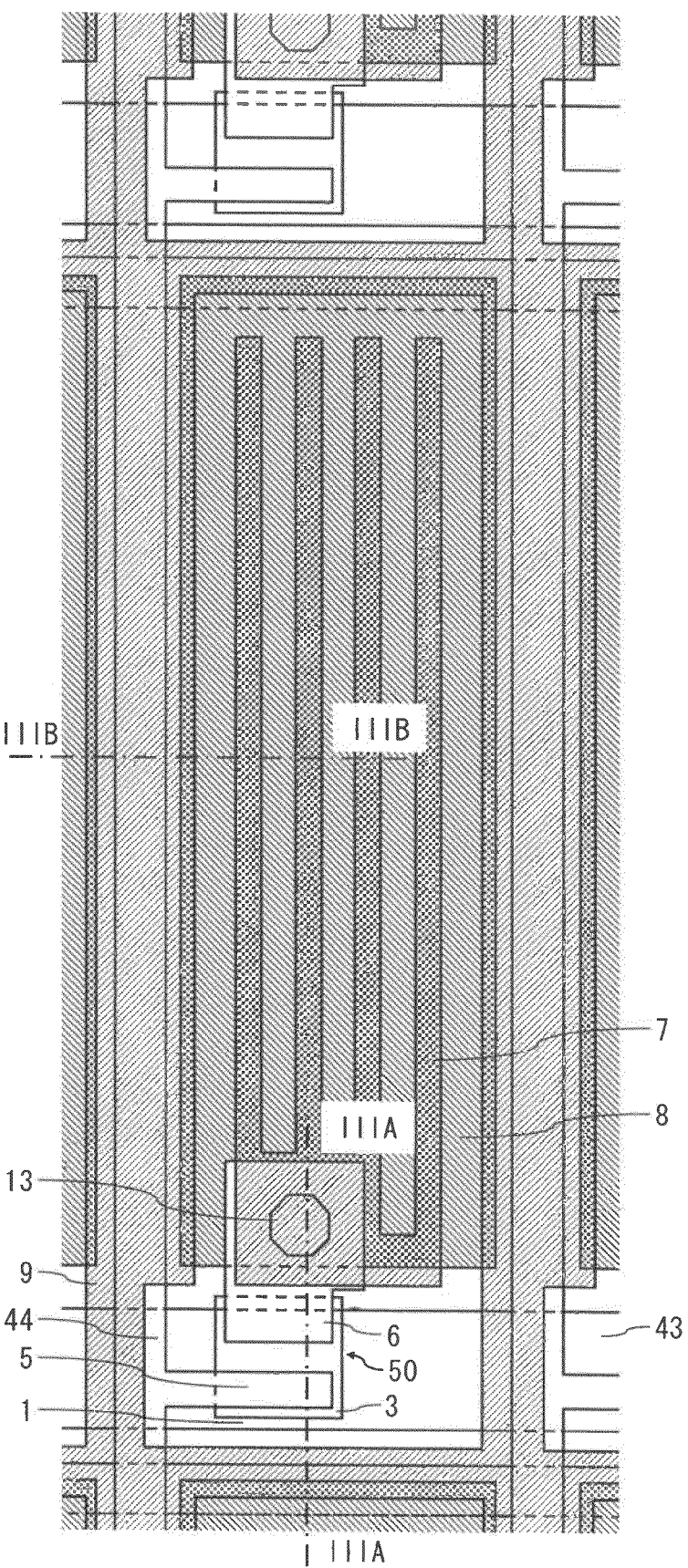
FIG. 2 is a plan view showing the pixel structure of the TFT array substrate according to a first embodiment.
Figure 3A:
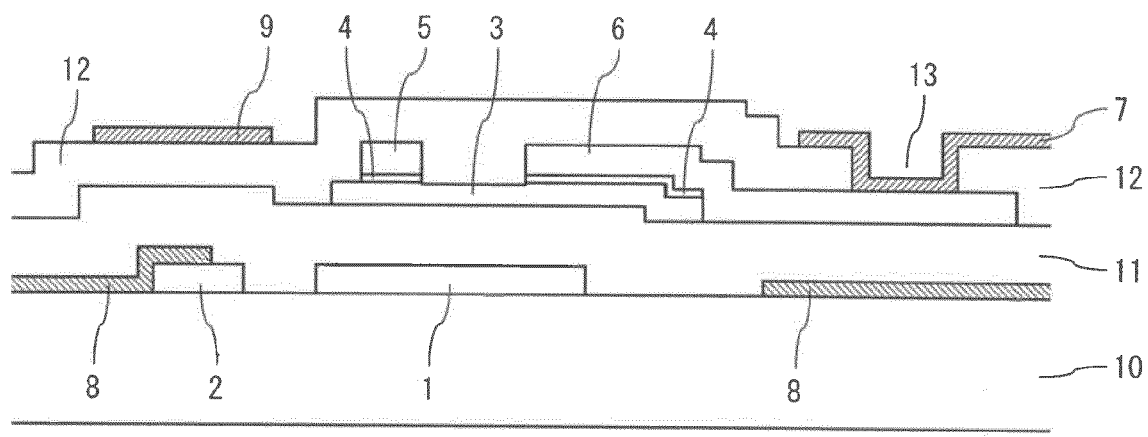
FIG. 3A is a sectional view along line IIIA-IIIA of FIG. 2 showing the pixel structure of the TFT array substrate according to the first embodiment.
Figure 3B:
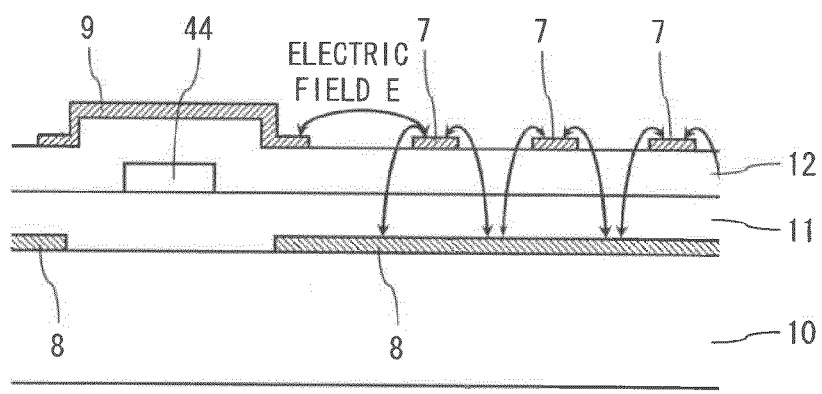
FIG. 3B is a sectional view along line IIIB-IIIB of FIG. 2 showing the pixel structure of the TFT array substrate according to the first embodiment.

The pixel structure of the liquid crystal display device according to the embodiment is described hereinafter with reference to FIGS. 2, 3A and 3B. FIG. 2 is a plan view showing the pixel structure of the TFT array substrate according to the first embodiment. FIGS. 3A and 3B are sectional views showing the pixel structure of the TFT array substrate according to the first embodiment. FIG. 2 shows one of the pixels 47 of the TFT array substrate. FIG. 3A is a sectional view along line IIIA-IIIA of FIG. 2, and FIG. 3B is a sectional view along line IIIB-IIIB of FIG. 2. The structure with the channel-etch type TFT 50 is described hereinbelow by way of illustration.

Referring to FIGS. 2, 3A and 3B, the gate line 43, a part of which serves as a gate electrode 1, is placed on the transparent insulating substrate 10 such as glass. Thus, the gate line 43 is electrically connected to the gate electrode 1 of the TFT 50. The gate line 43 extends linearly in one direction on the substrate 10. Further, on the substrate 10, a plurality of common lines 2 are placed in the same layer as the gate line 43. Each common line 2 is disposed between the adjacent gate lines 43. The plurality of common lines 2 are arranged in parallel. The common lines 2 and the gate lines 43 are arranged in substantially parallel with each other. The gate electrode 1, the gate line 43 and the common line 2 are made of Cr, Al, Ta, Ti, Mo, W, Ni, Cu, Au or Ag, an alloy film made mainly of those or a stacked film of those, for example.

A first counter electrode 8 is placed over the gate electrode 1, the gate line 43 and the common line 2. The first counter electrode 8 is placed substantially all over the pixel 47. In each pixel 47, the first counter electrode 8 is placed to partly overlap the common line 2. The first counter electrode 8 and the common lines 2 are directly in contact with each other and thus electrically connected to each other. Accordingly, the first counter electrodes 8 are electrically connected through the common line 2 between the adjacent pixels 47. The first counter electrode 8 is made of a transparent conductive layer such as ITO. In this way, the first counter electrode 8 is placed on the common line 2 in direct overlap, so that a part of the first counter electrode 8 is directly connected to the common line 2.

A gate insulating layer 11, which is a first insulating layer, is placed to cover the gate electrode 1, the gate line 43, the common line 2 and the first counter electrode 8. The gate insulating layer 11 is made of an insulating layer such as silicon nitride and silicon oxide. In order to prevent short-circuit due to the occurrence of a layer defect such as a pinhole, the gate insulating layer 11 preferably has a stacked structure composed of a plurality of layers.

Further, in the formation area of the TFT 50, a semiconductor layer 3 is placed opposite to the gate electrode 1 with the gate insulating layer 11 interposed therebetween. In this example, the semiconductor layer 3 is placed on the gate insulating layer 11 so as to overlap the gate line 43, and the gate line 43 in the area that overlaps the semiconductor layer 3 serves as the gate electrode 1. The semiconductor layer 3 is made of amorphous silicon, polycrystalline polysilicon or the like, for example.

Further, ohmic contact layers 4 into which conductive impurity is doped are placed on both ends of the semiconductor layer 3. The parts of the semiconductor layer 3 corresponding to the ohmic contact layers 4 are source and drain regions, respectively. Specifically, the part of the semiconductor layer 3 corresponding to the ohmic contact layer 4 on the left side of FIG. 3A serves as the source region. The part of the semiconductor layer 3 corresponding to the ohmic contact layer 4 on the right side of FIG. 3A serves as the drain region. In this manner, the source and drain regions are formed at the both ends of the semiconductor layer 3. The part of the semiconductor layer 3 between the source and drain regions serves as a channel region. The ohmic contact layer 4 is not placed on the channel region of the semiconductor layer 3. The ohmic contact layer 4 is made of n-type amorphous silicon, n-type polycrystalline silicon or the like into which impurity such as phosphorus (P) is doped at high concentration, for example.

A source electrode 5 and a drain electrode 6 are respectively placed on the ohmic contact layers 4. Specifically, the source electrode 5 is placed on the ohmic contact layer 4 on the source region side. The drain electrode 6 is placed on the ohmic contact layer 4 on the drain region side. The channel-etch type TFT 50 is formed in this manner. The source electrode 5 and the drain electrode 6 extend to the outside of the channel region of the semiconductor layer 3. Thus, like the ohmic contact layers 4, the source electrode 5 and the drain electrode 6 are not placed on the channel region of the semiconductor layer 3.

The source electrode 5 extends to the outside of the channel region of the semiconductor layer 3 and is connected to the source line 44. The source line 44 is thereby electrically connected to the source electrode 5 of the TFT 50. The source line 44 is placed on the gate insulating layer 11 and linearly extends in the direction to intersect the gate line 43 on the substrate 10. Thus, the source line 44 branches off and extends along the gate line 43 at the intersection with the gate line 43, to form the source electrode 5.

On the other hand, the drain electrode 6 extends to the outside of the channel region of the semiconductor layer 3 and thus has an extending portion that extends to the outside of the TFT 50. The source electrode 5, the drain electrode 6 and the source line 44 are made of Cr, Al, Ta, Ti, Mo, W, Ni, Cu, Au or Ag, an alloy film made mainly of those or a stacked film of those, for example.

Further, an interlayer insulating layer 12, which is a second insulating layer, is placed to cover the source electrode 5, the drain electrode 6 and the source line 44. The interlayer insulating layer 12 is made of an inorganic insulating layer such as silicon nitride and silicon oxide. Further, a contact hole 13 that penetrates the interlayer insulating layer 12 exists above the drain electrode 6. In this example, the interlayer insulating layer 12 has the contact hole 13 that reaches the extending portion of the drain electrode 6.

On the interlayer insulating layer 12, a pixel electrode 7 that comes into contact with the drain electrode 6 at the contact hole 13 is placed. The pixel electrode 7 has a comb-shape in each pixel 47. The pixel electrode 7 is placed opposite to the first counter electrode 8 with the interlayer insulating layer 12 and the gate insulating layer 11 interposed therebetween. Thus, an oblique electric field (fringe electric field) is generated between the comb-shaped pixel electrode 7 and the first counter electrode 8.

Further, a second counter electrode 9 is placed on the interlayer insulating layer 12 in the same layer as the pixel electrode 7. The pixel electrode 7 and the second counter electrode 9 are made of a transparent conductive layer such as ITO. The second counter electrode 9 overlaps the source line 44 in a given area and thus partly covers the source line 44.

Specifically, as shown in FIGS. 2 and 3B, the second counter electrode 9, which is wider than the source line 44, is placed opposite to the source line 44 with the interlayer insulating layer 12 interposed therebetween. The second counter electrode 9 covers a large portion of the source line 44 in the pixel area. Thus, a large portion of the source line 44 except the portion intersecting with the gate line 43 and the common line 2 overlaps the second counter electrode 9. The portion of the second counter electrode 9 covering the source line 44 protrudes from the both sides of the source line 44. The second counter electrode 9 lies across a plurality of pixels 47, extending along the source line 44. Accordingly, a plurality of second counter electrodes 9 are arranged in parallel in the display area 41. Further, the second counter electrode 9 is electrically connected to the first counter electrode 8 in the frame area 42. A common voltage is supplied to the second counter electrode 9 and the first counter electrode 8.

In this structure, an electric field that is generated from the source line 44 is shielded by the second counter electrode 9 and does not reach the liquid crystal, thereby reducing variations in the orientation state of the liquid crystal. This significantly reduces the light leakage due to the electric field generated by the source line 44, thus eliminating the need to form a black matrix over a wide range to cover the source line 44 on the counter substrate side. It is thereby possible to reduce the size of the non-transmitting region in the vicinity of the source line 44, thus improving the aperture ratio. The width of the second counter electrode 9 that covers the source line 44 is preferably larger than that of the source line 44 by 2 µm or more each side. The electric field from the source line 44 is thereby shielded effectively.

Further, the second counter electrode 9 having such a structure generates an in-plane electric field with the adjacent pixel electrode 7. This allows the liquid crystal in the vicinity of the source line 44 to be driven. Thus, the liquid crystal in the area where the oblique electric field does not reach is driven by the in-plane electric field. This ensures contribution of the liquid crystal in the vicinity of the source line 44 to display, thereby substantially improving the aperture ratio.

As described above, in this embodiment, an FFS-mode operation is performed between the pixel electrode 7 and the first counter electrode 8, and an IPS-mode operation is performed between the pixel electrode 7 and the second counter electrode 9. Specifically, as shown in FIG. 3B, an oblique electric field E is generated between the pixel electrode 7 and the first counter electrode 8, and an in-plane electric field E is generated between the pixel electrode 7 and the second counter electrode 9. Therefore, the liquid crystal display device according to the embodiment has a hybrid structure that mainly operates in the FFS mode in the pixels and operates in the IPS mode in the vicinity of the source line 44.

In this embodiment, the second counter electrodes 9 are arranged in lattice form as shown in FIG. 2. Specifically, the second counter electrodes 9 are formed both in the direction along the source line 44 and in the direction along the gate line 43, thus forming a lattice structure. The second counter electrode 9 in the direction along the source line 44 is placed so as to cover the source line 44 in a given area as described earlier. The second counter electrode 9 in the direction along the gate line 43 is placed between the ends of the comb teeth of the comb-shaped pixel electrode 7 and the gate line 43. In this example, the second counter electrode 9 is placed to overlap the common line 2. Thus, an in-plane electric field is generated also between the ends of the comb teeth of the pixel electrode 7 and the second counter electrode 9. In this manner, in one pixel 47, the pixel electrode 7 is disposed in the area surrounded by the second counter electrode 9 and the gate line 43. This effectively drives not only the liquid crystal in the central area of the pixel 47 but also the liquid crystal in the peripheral area of the pixel 47, thereby substantially improving the aperture ratio.

Hereinafter, a method of manufacturing the liquid crystal display device according to the embodiment is described. Firstly, a conductive layer made of Cr, Al, Ta, Ti, Mo, W, Ni, Cu, Au or Ag, an alloy film made mainly of those or a stacked film of those is deposited all over the transparent insulating substrate 10 such as glass. The conductive layer is formed all over the substrate 10 by sputtering or vapor deposition, for example. Next, a resist is applied thereon, and the applied resist is exposed to light through a photomask. The resist is then developed, thereby pattering the resist. This series of processes is referred to hereinafter as photolithography. After that, the conductive layer is etched using the resist pattern as a mask, and then the photoresist pattern is removed. This process is referred to hereinafter as micropatterning. The gate electrode 1, the gate line 43 and the common line 2 are thereby patterned.

Next, a transparent conductive layer such as ITO is deposited all over the substrate 10 by sputtering, vapor deposition or the like so as to cover the gate electrode 1, the gate line 43 and the common line 2. Then, the transparent conductive layer is patterned by photolithography and micropatterning. The first counter electrode 8 made of the transparent conductive layer is thereby formed in a large portion of the area to serve as the pixel 47. In this example, the first counter electrode 8 is formed so as to partly overlap the common line 2.

Then, a first insulating layer to serve as the gate insulating layer 11, a material of the semiconductor layer 3 and a material of the ohmic contact layer 4 are deposited in this order so as to cover the gate electrode 1, the gate line 43, the common line 2 and the first counter electrode 8. They are formed all over the substrate 10 by plasma CVD, atmospheric pressure CVD, low pressure CVD or the like, for example. Silicon nitride, silicon oxide or the like may be used as the gate insulating layer 11. The gate insulating layer 11 is preferably deposited a plurality of times in order to prevent short-circuit due to the occurrence of a layer defect such as a pinhole.

The material of the semiconductor layer 3 may be amorphous silicon, polycrystalline polysilicon or the like. The material of the ohmic contact layer 4 may be n-type amorphous silicon, n-type polycrystalline silicon or the like into which impurity such as phosphorus (P) is doped at high concentration, for example. After that, the material of the semiconductor layer 3 and the material of the ohmic contact layer 4 are patterned into an island shape above the gate electrode 1 by photolithography and micropatterning.

After that, a conductive layer made of Cr, Al, Ta, Ti, Mo, W, Ni, Cu, Au or Ag, an alloy film made mainly of those or a stacked film of those is deposited all over the substrate 10. The conductive layer is formed by sputtering or vapor deposition, for example. Then, the conductive layer is patterned by photolithography and micropatterning, thereby forming the source electrode 5, the drain electrode 6 and the source line 44.

Then, the layer to serve as the ohmic contact layer 4 is etched using the source electrode 5 and the drain electrode 6 as a mask. Specifically, the part of the ohmic contact layer 4 having an island shape which is not covered with the source electrode 5 and the drain electrode 6 is removed by etching. The semiconductor layer 3 having the channel region between the source electrode 5 and the drain electrode 6 and the ohmic contact layer 4 are thereby formed. Although the etching is performed using the source electrode 5 and the drain electrode 6 as a mask in this example, the etching of the ohmic contact layer 4 may be performed using the resist pattern that has been used when patterning the source electrode 5 and the drain electrode 6 as a mask. In this case, the ohmic contact layer 4 is etched before removing the resist pattern on the source electrode 5 and the drain electrode 6.

After that, a second insulating layer to serve as the interlayer insulating layer 12 is deposited thereon. For example, an inorganic insulating layer such as silicon nitride and silicon oxide is deposited as the interlayer insulating layer 12 all over the substrate 10 by CVD or the like. The channel region of the semiconductor layer 3 is thereby covered with the interlayer insulating layer 12. Then, the interlayer insulating layer 12 is patterned by photolithography and micropatterning, thereby forming the contact hole 13 above the drain electrode 6. The interlayer insulating layer 12 on the drain electrode 6 is thereby removed to expose a part of the drain electrode 6. At the same time as forming the contact hole 13, a contact hole (not shown) for electrically connecting the common line 2 and the second counter electrode 9, which is formed in the step described later, is formed in the frame area 42. Further, because terminals (not shown) to be connected to the scanning signal driving circuit 45 or the display signal driving circuit 46 are formed in the same layer as the gate line 43 or the source line 44 in the frame area 42, contact holes to reach the terminals are formed in the interlayer insulating layer 12 and the gate insulating layer 11.

Then, a transparent conductive layer such as ITO is deposited on the interlayer insulating layer 12 all over the substrate 10 by sputtering or the like. The transparent conductive layer is then patterned by photolithography and micropatterning. The pixel electrode 7 connected to the drain electrode 6 through the contact hole 13 is thereby formed. The pixel electrode 7 is formed in a comb shape so as to generate an oblique electric field with the first counter electrode 8. Further, the second counter electrode 9 is formed in lattice form as a pattern spaced from the pixel electrode 7 so as to cover a large portion of the source line 44. In order to establish an electrical connection with the first counter electrode 8, the second counter electrode 9 is formed to be connected to the common line 2 through a contact hole in the frame area 42. Further, in the frame area 42, a gate terminal pad to be connected to a gate terminal through a contact hole is formed by the same transparent conducive layer as the pixel electrode 7 and the second counter electrode 9. Likewise, a source terminal pad to be connected to a source terminal through a contact hole is formed by the same transparent conducive layer as the pixel electrode 7 and the second counter electrode 9. By the processes described above, the TFT array substrate according to the embodiment is completed.

On the TFT array substrate fabricated as above, an alignment layer is formed by the subsequent cell manufacturing process. Further, an alignment layer is formed also on a counter substrate that is fabricated separately. Then, an alignment process (rubbing process) is performed on the alignment layers so as to make micro scratches in one direction on contact surfaces with liquid crystal. After that, a sealing material is applied to attach the TFT array substrate and the counter substrate together. After attaching the TFT array substrate and the counter substrate, liquid crystal is filled through a liquid crystal filling port by vacuum filling method or the like. The liquid crystal filling port is then sealed. Further, polarization plates are attached to both sides of the liquid crystal cell that is formed in this manner, driving circuits are connected, and then a backlight unit is mounted. The liquid crystal display device according to the embodiment is thereby completed.

As described in the foregoing, in this embodiment, the comb-shaped pixel electrode 7 that is electrically connected to the drain electrode 6, the first counter electrode 8 that is placed below and opposite to the pixel electrode 7 with insulating layers interposed therebetween, and the second counter electrode 9 that covers the source line 44 in a given area are formed. Thus, the second counter electrode 9 blocks the electric field generated from the source line 44. Therefore, the electric field generated from the source line 44 does not reach the liquid crystal, so that the light leakage in the vicinity of the source line 44 is significantly reduced. This eliminates the need to form a black matrix over a wide range in the vicinity of the source line 44 on the counter substrate side, thereby further improving the aperture ratio of the liquid crystal display device.

Further, in this embodiment, the liquid crystal is driven by three electrodes: the pixel electrode 7, the first counter electrode 8 and the second counter electrode 9. Specifically, the pixel electrode 7 and the first counter electrode 8 generate an oblique electric field, and the pixel electrode 7 and the second counter electrode 9 generate an in-plane electric field. It is thereby possible to effectively drive not only the liquid crystal in the central area of the pixel 47 but also the liquid crystal in the peripheral area of the pixel 47. This ensures that the liquid crystal in area where the oblique electric field does not reach in the structure according to related art contributes to display, thereby further improving the aperture ratio.

Although the case where the first counter electrode 8 is placed on top of the common line 2 is described in the embodiment by way of illustration, it may be placed under the common line 2. Specifically, the first counter electrode 8 may be directly placed under the common line 2 in such a way that it is partly in direct overlap with the common line 2. In this case, the first counter electrode 8 is formed before the gate electrode 1, the gate line 43 and the common line 2 are formed. Further, the shape of the pixel electrode 7 is not limited to a comb shape, and it may be a slit shape. Specifically, the pixel electrode 7 may have slits to generate a fringe electric field with the first counter electrode 8.

Second Embodiment

Figure 4:
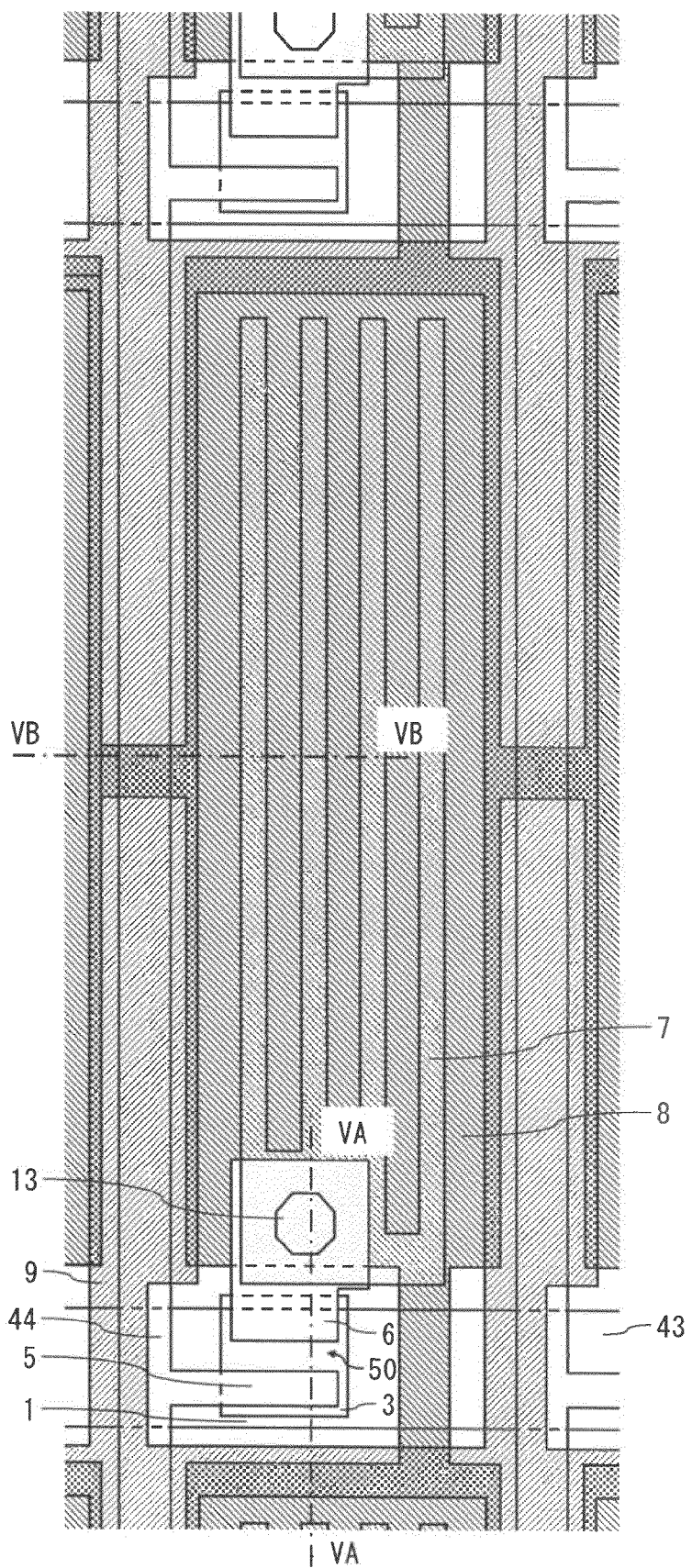
FIG. 4 is a plan view showing the pixel structure of a TFT array substrate according to a second embodiment.
Figure 5A:
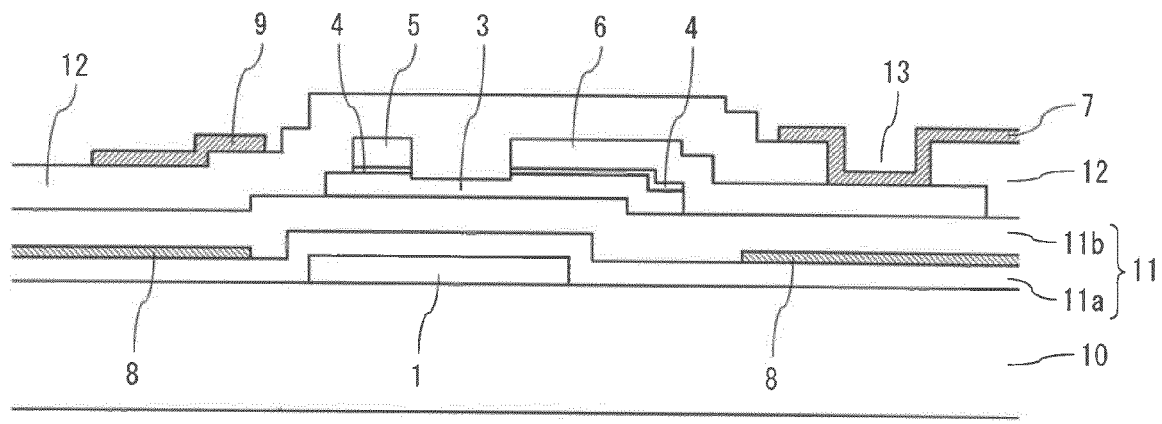
FIG. 5A is a sectional view along line VA-VA of FIG. 4 showing the pixel structure of the TFT array substrate according to the second embodiment.
Figure 5B:
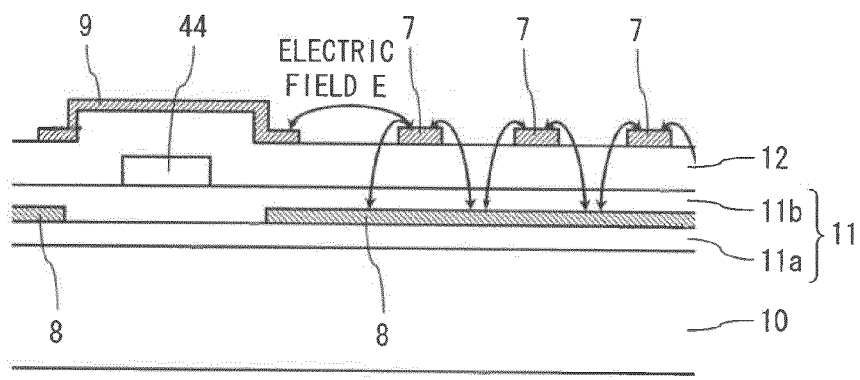
FIG. 5B is a sectional view along line VB-VB of FIG. 4 showing the pixel structure of the TFT array substrate according to the second embodiment.

The pixel structure of a liquid crystal display device according to a second embodiment of the present invention is described hereinafter with reference to FIGS. 4, 5A and 5B. The basic structure of the liquid crystal display device according to this embodiment is the same as the one according to the first embodiment and thus repeated description is omitted. This embodiment is different from the first embodiment in the pixel structure of the TFT array substrate. FIG. 4 is a plan view showing the pixel structure of the TFT array substrate according to the second embodiment. FIGS. 5A and 5B are sectional views showing the pixel structure of the TFT array substrate according to the second embodiment. FIG. 4 shows one of the pixels 47 of the TFT array substrate. FIG. 5A is a sectional view along line VA-VA of FIG. 4, and FIG. 5B is a sectional view along line VB-VB of FIG. 4.

In this embodiment, the gate insulating layer 11 includes a first gate insulating layer 11a and a second gate insulating layer 11b as shown in FIG. 5A. Specifically, the first gate insulating layer 11a is placed as a lower layer of the gate insulating layer 11, and the second gate insulating layer 11b is placed as an upper layer of the gate insulating layer 11. The gate insulating layer 11 thus has a stacked structure composed of the first gate insulating layer 11a and the second gate insulating layer 11b lying on top of each other. The first counter electrode 8 is placed between the first gate insulating layer 11a and the second gate insulating layer 11b.

Specifically, the first gate insulating layer 11a is placed to cover the gate electrode 1 and the gate line 43 that are placed on the substrate 10. On the first gate insulating layer 11a, the first counter electrode 8 is placed. In this embodiment, the first counter electrode 8 is placed across at least part of the source line 44 and thus formed integrally with the first counter electrode 8 of the adjacent pixel across the source line 44. Further, the first counter electrode 8 is placed across at least part of the gate line 43 and thus formed integrally with the first counter electrode 8 of the adjacent pixel across the gate line 43. In other words, the first counter electrode 8 intersects with at least part of the gate line 43 and at least part of the source line 44 and is connected to the first counter electrode 8 of the adjacent pixel. Therefore, the first counter electrodes 8 in the adjacent pixels are formed in an integral manner, so that the first counter electrodes 8 in the display area 41 are joined in a planar fashion. Then, the second gate insulating layer 11b is placed to cover the first counter electrode 8.

The first gate insulating layer 11a and the second gate insulating layer 11b are made of an insulating layer such as silicon nitride and silicon oxide. The pixel electrode 7 according to the embodiment is placed opposite to the first counter electrode 8 with the interlayer insulating layer 12 and the second gate insulating layer 11b interposed therebetween, and an oblique electric field (fringe electric field) is generated therebetween just like in the first embodiment. The other structure is the same as that of the first embodiment and not repeatedly described below.

In the fabrication of the TFT array substrate having the above structure, the gate electrode 1 and the gate line 43 are formed on the substrate 10, and then the first gate insulating layer 11a is formed all over the substrate 10 so as to cover them. Next, the first counter electrode 8 is formed on the first gate insulating layer 11a in an integral form between adjacent pixels. Then, the second gate insulating layer 11b is formed all over the substrate 10 so as to cover the first counter electrode 8. The gate insulating layer 11 composed of two stacked insulating layers, the first gate insulating layer 11a and the second gate insulating layer 11b, is thereby formed. The subsequent steps are the same as those of the first embodiment and thus not repeatedly described below. In this embodiment, when forming the contact hole 13 in the interlayer insulating layer 12, a contact hole for connecting the first counter electrode 8 and the second counter electrode 9 is formed in the frame area 42 at the same time. Then, the second counter electrode 9 is formed so as to be connected to the first counter electrode 8 through the contact hole.

As described above, in this embodiment, the gate insulating layer 11 is a stacked layer of the first gate insulating layer 11a and the second gate insulating layer 11b, and the first counter electrode 8 is placed therebetween. Thus, the first counter electrode 8 is disposed so that the first gate insulating layer 11a is placed between the gate line 43 and the first counter electrode 8 as shown in FIG. 5A. Further, the first counter electrode 8 is disposed so that the second gate insulating layer 11b is placed between the source line 44 and the first counter electrode 8 as shown in FIG. 5B. Thus, the first counter electrode 8 is placed in a different layer from the source line 44 and the gate line 43 respectively with an insulating layer interposed therebetween. Therefore, even if the first counter electrode 8 is placed overlapping the source line 44 and the gate line 43, electrical insulation is maintained from the source line 44 and the gate line 43. This allows the first counter electrodes 8 to be integrated in mesh in the entire display area 41 as described above. Specifically, the first counter electrodes 8 of all pixels 47 in the display area 41 are integrally formed and electrically connected. The first counter electrode 8 with such a structure has a sufficiently low resistance. This eliminates the need for the common line 2 to supply a common voltage to the first counter electrode 8 of the respective pixels 47, which is shown in the first embodiment of FIG. 2. It is thus not necessary to place the non-transmitting common line 2, thereby further improving the aperture ratio.

Figure 6A:
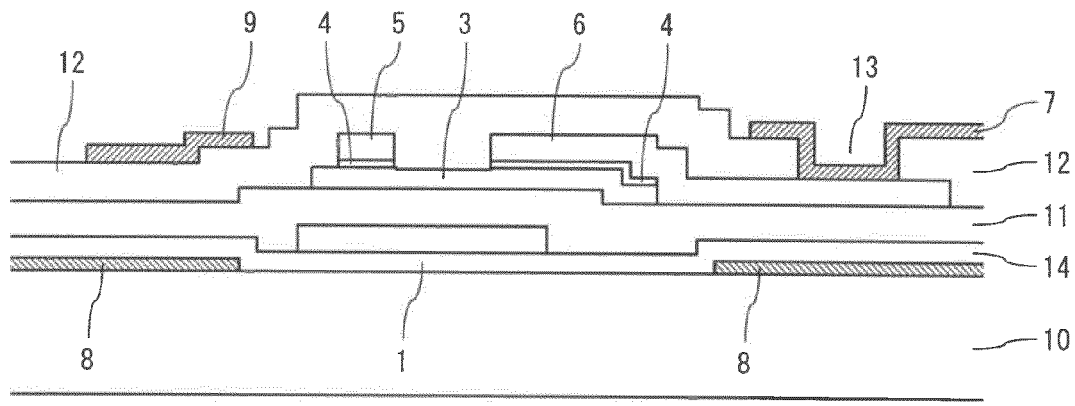
FIG. 6A is a sectional view, corresponding to the cross section along line VA-VA of FIG. 4, showing the pixel structure of a TFT array substrate according to another example of the second embodiment.
Figure 6B:
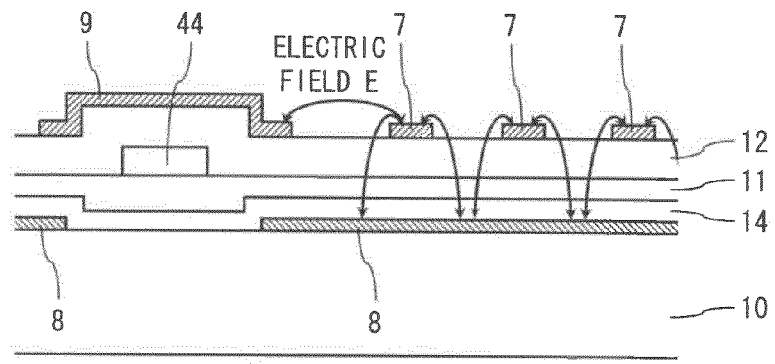
FIG. 6B is a sectional view, corresponding to the cross section along line VB-VB of FIG. 4, showing the pixel structure of the TFT array substrate according to another example of the second embodiment.

Although the first counter electrode 8 is placed between the first gate insulating layer 11a and the second gate insulating layer 11b in order to integrate the first counter electrodes 8 between the adjacent pixels 47 in the above description, the present invention is not limited to such a structure. The structure may be altered as appropriate as long as the first counter electrode 8 can generate an oblique electric field together with the pixel electrode 7 and maintain insulation from the source line 44 and the gate line 43. For example, the first counter electrode 8 may be placed below the gate electrode 1 and the gate line 43 with an insulating layer interposed therebetween. FIGS. 6A and 6B are sectional views showing the pixel structure of a TFT array substrate according to another example of the second embodiment. FIG. 6A is a sectional view corresponding to the cross section along line VA-VA of FIG. 4, and FIG. 6B is a sectional view corresponding to the cross section along line VB-VB of FIG. 4.

As shown in FIGS. 6A and 6B, a lower insulating layer 14 is placed to cover the first counter electrode 8 that is formed on the substrate 10. The gate electrode 1 and the gate line 43 are placed on the lower insulating layer 14. The lower insulating layer 14 is an insulating layer such as silicon nitride and silicon oxide. Further, the gate insulating layer 11 is placed to cover the gate electrode 1 and the gate line 43. The pixel electrode 7 is placed opposite to the first counter electrode 8 with the interlayer insulating layer 12, the gate insulating layer 11 and the lower insulating layer 14 interposed therebetween, so that an oblique electric field (fringe electric field) is generated therebetween just like in the first embodiment. In this example, the lower insulating layer 14 serves as a first insulating layer, the gate insulating layer 11 serves as a second insulating layer, and the interlayer insulating layer 12 serves as a third insulating layer. The other structure is the same as that of the first embodiment and not repeatedly described below. In this case, the step of forming the first counter electrode 8 and the lower insulating layer 14 is added before the step of forming the gate electrode 1 and the gate line 43. Specifically, after the first counter electrode 8 is formed on the substrate 10, the lower insulating layer 14 is formed all over the substrate 10. After that, the gate electrode 1 and the gate line 43 are formed, and then the gate insulating layer 11 is formed all over the substrate 10. The subsequent steps are the same as those of the first embodiment.

Although the liquid crystal display device including the channel-etch type TFT 50 is described in the first and second embodiments, it may include another type of the TFT 50, such as a top-gate type.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A liquid crystal display device including a thin film transistor placed above a substrate, comprising:
    a gate line electrically connected to a gate electrode of the thin film transistor;
    a gate insulating layer to cover the gate line;
    a source line placed above the gate insulating layer and electrically connected to a source electrode of the thin film transistor, the source line extending in a length direction of the device across a plurality of pixels;
    an interlayer insulating layer to cover the source line;
    a pixel electrode having a comb shape or a slit shape and electrically connected a drain electrode of the thin film transistor through a contact hole penetrating the interlayer insulating layer;
    a first counter electrode placed below and opposite to the pixel electrode with an insulating layer interposed therebetween, to generate an oblique electric field with the pixel electrode; and
    a second counter electrode formed in the same layer as the pixel electrode and placed overlapping the source line in a given area, to generate an in-plane electric field with the pixel electrode, the second counter electrode extending over the source line in the length direction across the plurality of pixels.

2. The liquid crystal display device according to claim 1, wherein the pixel electrode, the first counter electrode and the second counter electrode are made of transparent conductive layers.

3. A liquid crystal display device including a thin film transistor placed above a substrate, comprising:
- a gate line electrically connected to a gate electrode of the thin film transistor;
- a gate insulating layer to cover the gate line;
- a source line placed above the gate insulating layer and electrically connected to a source electrode of the thin film transistor;
- an interlayer insulating layer to cover the source line;
- a pixel electrode having a comb shape or a slit shape and electrically connected a drain electrode of the thin film transistor through a contact hole penetrating the interlayer insulating layer;
- a first counter electrode placed below and opposite to the pixel electrode with an insulating layer interposed therebetween, to generate an oblique electric field with the pixel electrode;
- a second counter electrode formed in the same layer as the pixel electrode and placed overlapping the source line in a given area, to generate an in-plane electric field with the pixel electrode; and
- a common line formed in the same layer as the gate line, wherein the first counter electrode is placed directly over or under the common line, so that a part of the first counter electrode directly overlaps the common line.

4. The liquid crystal display device according to claim 3, wherein the pixel electrode, the first counter electrode and the second counter electrode are made of transparent conductive layers.

5. A liquid crystal display device including a thin film transistor placed above a substrate, comprising:
- a gate line electrically connected to a gate electrode of the thin film transistor;
- a gate insulating layer to cover the gate line;
- a source line placed above the gate insulating layer and electrically connected to a source electrode of the thin film transistor;
- an interlayer insulating layer to cover the source line;
- a pixel electrode having a comb shape or a slit shape and electrically connected a drain electrode of the thin film transistor through a contact hole penetrating the interlayer insulating layer;
- a first counter electrode placed below and opposite to the pixel electrode with an insulating layer interposed therebetween, to generate an oblique electric field with the pixel electrode; and
- a second counter electrode formed in the same layer as the pixel electrode and placed overlapping the source line in a given area, to generate an in-plane electric field with the pixel electrode,
- wherein the first counter electrode is formed in a different layer from the gate line and the source line with an insulating layer interposed therebetween, intersects at least part of the gate line and at least part of the source line, and is integrated with the first counter electrode in an adjacent pixel.

6. The liquid crystal display device according to claim 5, wherein the gate insulating layer includes: a first gate insulating layer placed on the gate line side; and a second gate insulating layer placed above the first gate insulating layer, and the first counter electrode is placed between the first gate insulating layer and the second gate insulating layer.

7. The liquid crystal display device according to claim 5, further comprising: a lower insulating layer placed below the gate line, wherein the first counter electrode is placed below the lower insulating layer.

8. The liquid crystal display device according to claim 5, wherein the pixel electrode, the first counter electrode and the second counter electrode are made of transparent conductive layers.

9. A liquid crystal display device including a thin film transistor placed above a substrate, comprising:
- a gate line electrically connected to a gate electrode of the thin film transistor;
- a gate insulating layer to cover the gate line;
- a source line placed above the gate insulating layer and electrically connected to a source electrode of the thin film transistor;
- an interlayer insulating layer to cover the source line;
- a pixel electrode having a comb shape or a slit shape and electrically connected a drain electrode of the thin film transistor through a contact hole penetrating the interlayer insulating layer;
- a first counter electrode placed below and opposite to the pixel electrode with an insulating layer interposed therebetween, to generate an oblique electric field with the pixel electrode, a majority of an area of the first counter electrode overlaps the pixel electrode; and
- a second counter electrode formed in the same layer as the pixel electrode and placed overlapping the source line in a given area, to generate an in-plane electric field with the pixel electrode.

* * * * *